US006593167B2

(12) United States Patent
Dobashi et al.

(10) Patent No.: US 6,593,167 B2
(45) Date of Patent: Jul. 15, 2003

(54) IC CARD INDICATING STATE OF USAGE AND SYSTEM THEREFOR

(75) Inventors: Hisanobu Dobashi, Tokyo (JP); Shinji Nishimura, Tokyo (JP); Toshinori Sonehara, Tokyo (JP)

(73) Assignee: Nippon Telegraph and Telephone Corporation (JP)

( * ) Notice: Subject to any disclaimer, the term of this patent is extended or adjusted under 35 U.S.C. 154(b) by 20 days.

(21) Appl. No.: 10/214,373

(22) Filed: Aug. 6, 2002

(65) Prior Publication Data

US 2002/0190364 A1 Dec. 19, 2002

Related U.S. Application Data

(62) Division of application No. 09/138,637, filed on Aug. 24, 1998, now Pat. No. 6,465,880.

(30) Foreign Application Priority Data

Aug. 28, 1997 (JP) ............................................. 9-247713

(51) Int. Cl.⁷ ............................................. H01L 21/50
(52) U.S. Cl. ........................ 438/107; 438/118; 361/760
(58) Field of Search ................................. 438/107, 118, 438/119, 127, 613, 108, 121, 459, 460; 361/737, 760, 761, 764

(56) References Cited

FOREIGN PATENT DOCUMENTS

| EP | 0 583 526 A1 | 2/1994 |
| JP | 5-142342 | 6/1993 |
| JP | 8-55202 | 2/1996 |
| JP | 8-153177 | 6/1996 |

*Primary Examiner*—Roy Potter
(74) *Attorney, Agent, or Firm*—Pennie & Edmonds LLP

(57) ABSTRACT

An IC card whose state of usage can be judged by a user from an appearance of the card, and a relevant IC card system and method are provided. In an IC card fed electricity from an IC card reader-writer via feeding means using one of electromagnetic coupling and electrostatic coupling, and the IC card having an IC chip which communicates with the IC card reader-writer, the possible/impossible state of usage of the card by a user is determined using electric means for disconnecting or non-disconnecting the feeding means or providing another circuit and disconnecting this circuit, and appearance of the IC card is also changed at the time of the change caused by such electric means and thereby the state of usage of the card is indicated to the user.

12 Claims, 9 Drawing Sheets

ENLARGED VIEW OF NOTCH AREA IN PRE-USED STATE

ENLARGED VIEW OF NOTCH AREA IN USE

PRE-USED STATE

IN-USE STATE (PRE-USED STATE)

(IN-USE STATE)

PRE-USED STATE

IN-USE STATE

PRE-USED STATE

DEGREE OF USE

IN-USE STATE

DEGREE OF USE

IC CARD INDICATING STATE OF USAGE AND SYSTEM THEREFOR

This is a division of U.S. Patent Application 09/138,637 filed Aug. 24, 1998 now U.S. Pat. No. 6,465,880.

BACKGROUND OF THE INVENTION

1. Field of the Invention

The present invention relates to an IC card which is fed electricity by an IC card reader-writer via electromagnetic or electrostatic coupling (that is, power is supplied from the IC card reader-writer to the IC card), and between these IC card and IC card reader-writer, data transmission is performed. In particular, the present invention relates to an IC card having a function of indicating its state of usage and a system therefor, and a method for indicating a state of usage.

This application is based on Patent Applications No. Hei 9-247713 filed in Japan, the contents of which are incorporated herein by reference.

2. Description of the Related Art

In conventional prepaid cards such as phone cards, figures and punch holes are provided for indicating whether the card has already been used, or how much the card has been used. In more detail, on a back face (or the like) of the card, figures indicating charges and corresponding degrees of use are previously indicated from a lower limit to an upper limit, and by punching a hole near each figure, the present state of usage is shown to a user.

Regarding conventional contact and contactless IC cards, no means for indicating a state of usage is provided in the card itself, but only in a display area of an external device which includes an IC card reader-writer, a state of usage of the IC card is displayed.

FIG. 11 is a perspective view showing electromagnetic coupling type contactless IC card C100.

The IC card C100 comprises card substrate 100B, coil 100C for electromagnetic coupling, IC chip 100CH, and outside terminals (or pads) 100T$_1$ and 100T$_2$ for the IC chip. A PVC (polyvinyl chloride) resin, an ABS resin, or a PET (polyethylene terephthalate) resin may be used for making card substrate 100B. The IC chip 100CH and electromagnetic coupling coil 100C, which are connected to each other via outside terminals 100T$_1$ and 100T$_2$, are arranged inside the card substrate 100B or are put between two portions of the substrate. The contactless IC card C100 is electromagnetically coupled with IC card reader-writer 200 having electromagnetic coupling coil 200C, and thereby the IC card and the reader-writer are wirelessly communicated with each other.

The IC card reader-writer 200 comprises the electromagnetic coupling coil 200C which is electromagnetically coupled with coil 100C of IC card C100.

The thickness of conventional contact and contactless IC cards is larger than that of magnetic cards; thus, it is difficult to punch a hole and indicate a state of usage as in the case of a magnetic prepaid card. In addition, if a function of punching a hole is provided in public telephones, construction of the public telephone becomes complicated and thus trouble may be caused.

When the contactless IC card C100 wirelessly communicates with an external device including IC card reader-writer 200, the contactless IC card C100 is not attached to the above external device; thus, it is impossible to record, in a specified or predetermined area on a surface of the card, a state of usage of the card by, for example, punching a hole, as in the case of a magnetic prepaid card.

Therefore, even if the user of an IC card desires to know a state of usage of this IC card, that is, whether the card has already been used or how much the card has been used, the user cannot obtain information about the state of usage from the appearance of the card and thus it is inconvenient. Additionally, in the conventional situation, there occurs a problem in which fraudulent practices such as selling a used IC card on the pretence that it is a new card are possible.

SUMMARY OF THE INVENTION

In order to solve the above problems, an object of the present invention is to provide an IC card whose state of usage can be judged by a user from an appearance of the card, a relevant IC card system, and a method for indicating a state of usage of an IC card.

In order to realize the above object, the present invention provides an IC card fed electricity from an IC card reader-writer via feeding means using one of electromagnetic coupling and electrostatic coupling, and the IC card having an IC chip which communicates with the IC card reader-writer, wherein the possible/impossible state of usage of the card by a user is determined using electric means for disconnecting or non-disconnecting the feeding means or providing another circuit and disconnecting this circuit, and the appearance of the IC card is also changed at the time of the change caused by such electric means and thereby the state of usage of the card is indicated to the user.

The following are possible IC cards comprising an electric means:

(1) the IC card comprises a conductor for short-circuiting the feeding means, and becomes usable when the short-circuited state of the conductor is freed.

(2) the IC chip comprises two lead wire connecting terminals, and the IC card comprises a conductor for short-circuiting the two lead wire connecting terminals and becomes usable when the short-circuited state of the connecting terminals is freed.

(3) the IC card comprises means for generating a current having a reversed polarity with respect to a current generated by the feeding means, and becomes usable when the current of the reversed polarity is disconnected.

In order to make the card usable, it is possible to cut and separate a portion of the card. In cases (1) and (2) above, the IC card may have a notch and a portion of the conductor is exposed at the notch, and the short-circuited state may be freed by cutting the exposed conductor. In case (3) above, the IC card may have a notch and a portion of the means for generating the current having the reversed polarity is exposed at the notch, and the current of the reversed polarity may be disconnected by cutting the exposed portion of said means.

In case (2) above, it is also possible that before the IC card becomes usable, the IC card performs specified data communication prior to usage of the card, with the IC card reader-writer.

Generally, the IC card may comprise indicating means for indicating information relating to a state of usage of the IC card. Such indicating means can be easily realized using a fuse or a thermochromic material. In addition, a plurality of the fuses or thermochromic materials may be provided, and thereby it is possible to indicate whether the card reaches each of predetermined degrees of use.

The present invention also provides an IC card system comprising an IC card which has any of the above-described features and an IC card reader-writer. The present invention further provides a method of indicating a state of usage of an IC card having a corresponding feature.

According to the present invention, the user who obtains the IC card can easily and surely confirm that the IC card has not yet been used before the user suitably starts to use the card. It is also possible for the user to obtain information relating to a state of usage of the card in use.

DESCRIPTION OF THE PREFERRED EMBODIMENTS

Figure 1:
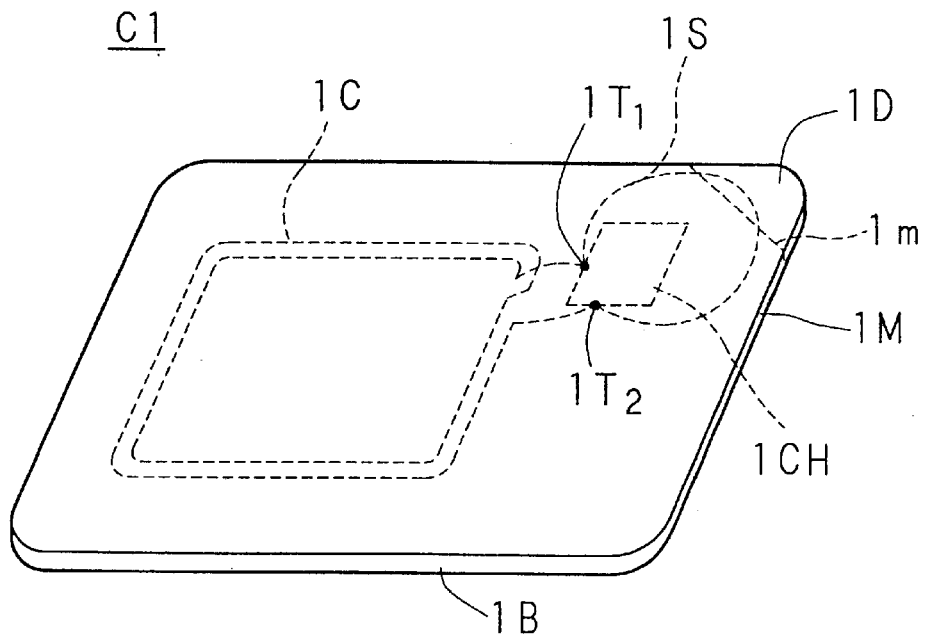
FIG. 1 is a perspective view of contactless IC card C1 of the first embodiment according to the present invention.

FIG. 1 is a perspective view of contactless IC card C1 of the first embodiment according to the present invention.

The contactless IC card C1 comprising card substrate 1B is composed of main body 1M and separable portion 1D. The main body 1M comprises electromagnetic coupling coil 1C, IC chip 1CH, and outside terminals $1T_1$ and $1T_2$, etc. The separable portion 1D has a portion of line 1S for short-circuiting electromagnetic coupling coil 1C.

The short-circuiting line 1S is connected with electromagnetic coupling coil 1C and connected to outside terminals $1T_1$ and $1T_2$ of IC chip 1CH so as to short-circuit electromagnetic coupling coil 1C. Between the main body 1M and separable portion 1D, perforation 1m is provided. By bending or twisting the IC card C1 with respect to the perforation 1m as a boundary, it is possible to separate the separable portion 1D from the main body 1M. According to this separation, short-circuiting line 1S is cut at perforation 1m as the boundary, and the line is opened.

Figure 11:
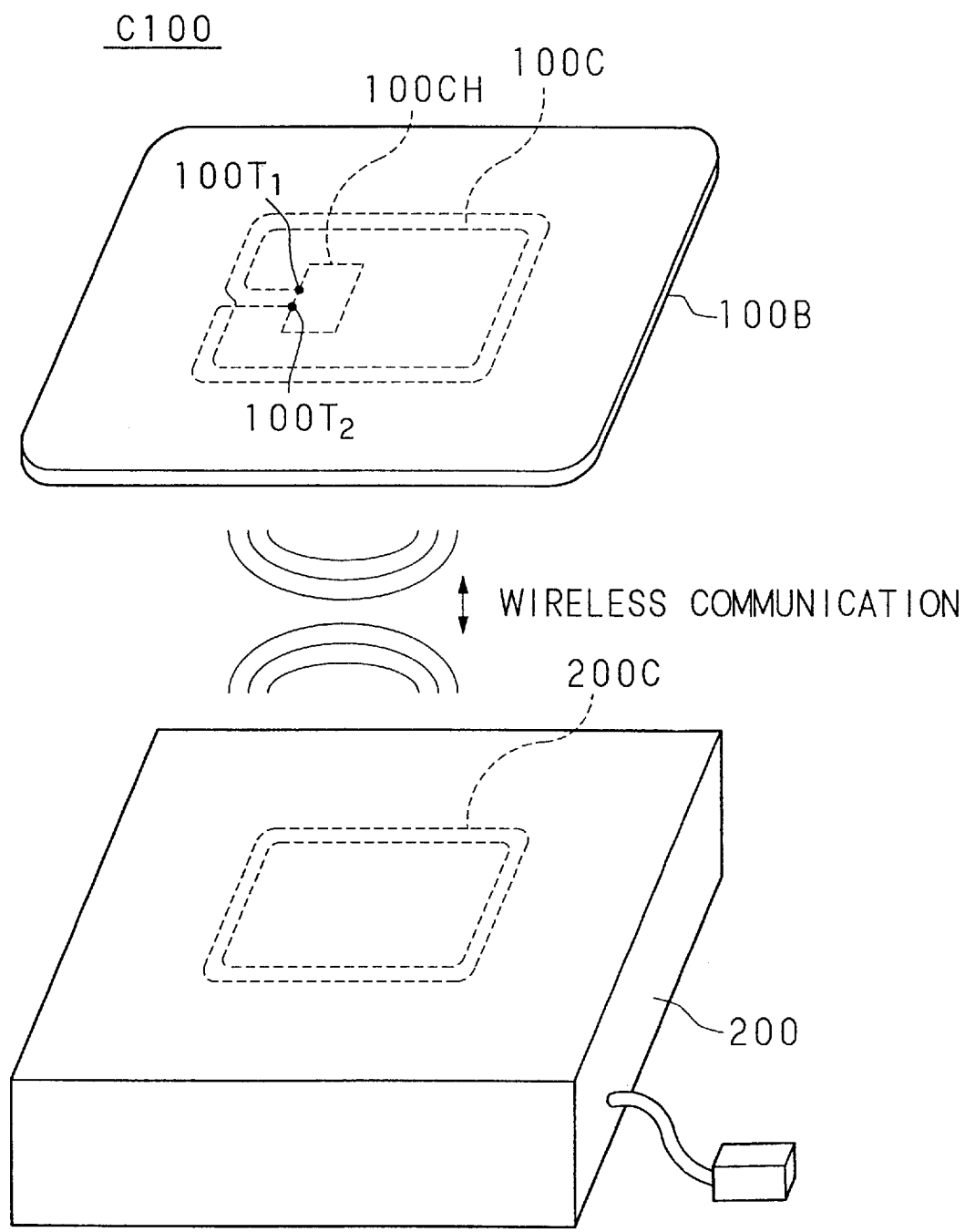
FIG. 11 is a perspective view showing electromagnetic coupling type contactless IC card C100 as a conventional example.

During a state in which the contactless IC card C1 has not yet been used and the main body 1M and the separable portion 1D are unified as a single body, when the IC card receives an electromagnetic wave from an IC card reader-writer such as reader-writer 200 shown in FIG. 11, current caused by electromagnetic induction flows in short-circuiting line 1S of smaller resistance and does not flow in IC chip 1CH. Therefore, it is impossible to supply power to the IC chip 1CH and communication is impossible. In such a situation, functions as the contactless IC card are not realized and the user cannot use this contactless IC card.

In order to enable the user to use this contactless IC card C1, the main body 1M and the separable portion 1D should be separated from each other. According to this separation, the short-circuiting line 1S is opened, and thereby when the card receives an electromagnetic wave from the IC card reader-writer, current caused by the electromagnetic induction flows in IC chip 1CH and the chip is fed electricity. Communication between the card and the reader-writer then becomes possible.

As explained above, in the above embodiment, it is possible to easily observe and judge whether the main body 1M and the separable portion 1D are unified or separated. Therefore, a pre-used contactless IC card C1 can be safely handed over from an issuer to a user, and thus fraudulent usage, which may occur before a user properly starts to use the card, can be prevented.

Here, the general formation of the IC card including separable portion 1D in FIG. 1 conforms to the standard ISO/IEC 7810 1D-1. However, only the main body 1M may conform to the above standard ISO/IEC 7810 1D-1 and separable portion 1D may be provided as a projecting portion.

On the other hand, the above short-circuiting line 1S may be a lead wire or a pattern using a copper foil or a silver paste. Such a variation is also possible for the second embodiment explained below.

Regarding the separation of the main body 1M and the separable portion 1D, the user may divide the two portions using hands, or a device like a blade cutter equipped in a cutter may be provided in an external device which includes an IC card reader-writer like reader-writer 200 as shown in FIG. 11, in a vending machine of contactless IC cards, or in a collection box for used contactless IC cards, so as to separate the portion 1D from the card. These variations are also applied to IC cards in the following embodiments having a similar separable form.

Figure 2:
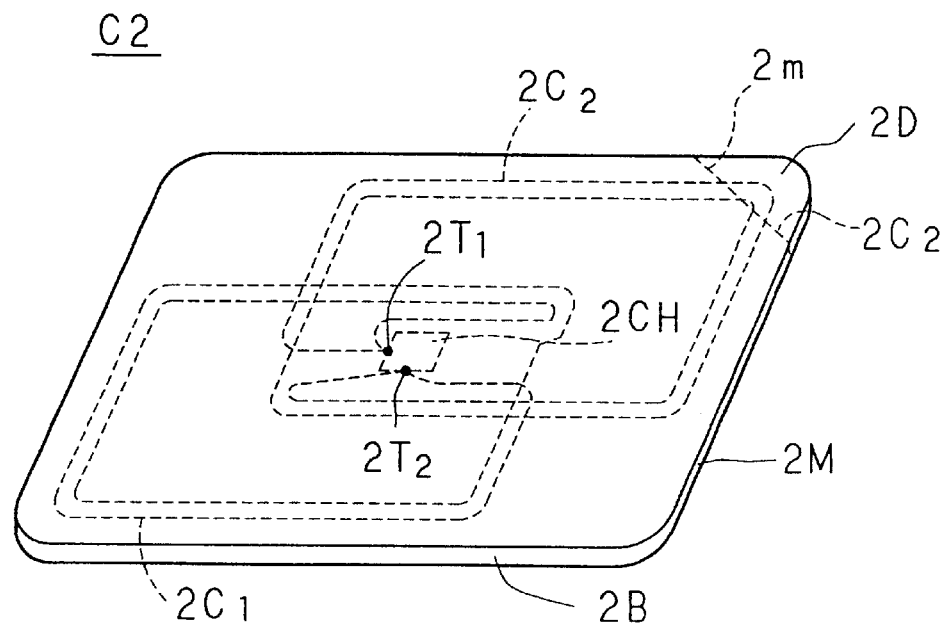
FIG. 2 is a perspective view of contactless IC card C2 of the second embodiment according to the present invention.

FIG. 2 is a perspective view of contactless IC card C2 of the second embodiment according to the present invention.

The contactless IC card C2 comprising card substrate 2B is composed of main body 2M and separable portion 2D. The main body 2M comprises electromagnetic coupling coils $2C_1$ and $2C_2$, IC chip 2CH, outside terminals $2T_1$ and $2T_2$. The separable portion 2D has a portion of electromagnetic coupling coil $2C_2$.

The electromagnetic coupling coils $2C_1$ and $2C_2$ have the same size and the same number of winding rounds, and the coils are respectively wound in reverse directions. Between the main body 2M and separable portion 2D, perforation 2m is provided. By bending or twisting the IC card C2 with respect to the perforation 2m as a boundary, it is possible to separate the separable portion 2D from the main body 2M. According to this separation, electromagnetic coupling coil $2C_2$ is cut at perforation 1m as the boundary, and the coil is opened.

During a state in which the contactless IC card C2 has not yet been used and the separable portion 2D is unified with the main body 2M, when the IC card receives an electromagnetic wave from an IC card reader-writer as reader-writer 200 shown in FIG. 11, current caused by electromagnetic induction flows respectively in electromagnetic coupling coils $2C_1$ and $2C_2$ in reverse directions; thus, current signals are canceled out by each other. Therefore, it is impossible to supply power to the IC chip 2CH and the main body 2M cannot send or receive any signal. In such a situation, functions of the contactless IC card are not realized and the user cannot use this contactless IC card C2.

In order to enable the user to use this contactless IC card C2, the main body 2M and the separable portion 2D should be separated from each other. According to this separation, the electromagnetic coupling coil $2C_2$ is opened and the signal from this coil cannot be transmitted.

Accordingly, a pre-used contactless IC card C2 can be safely handed over from an issuer to a user, and possible fraudulent usage before proper use by the user can be prevented. In addition, the electromagnetic coupling coils $2C_1$ and $2C_2$ can be formed using the same coil (material) and thus the cost can be reduced.

Figure 3A:
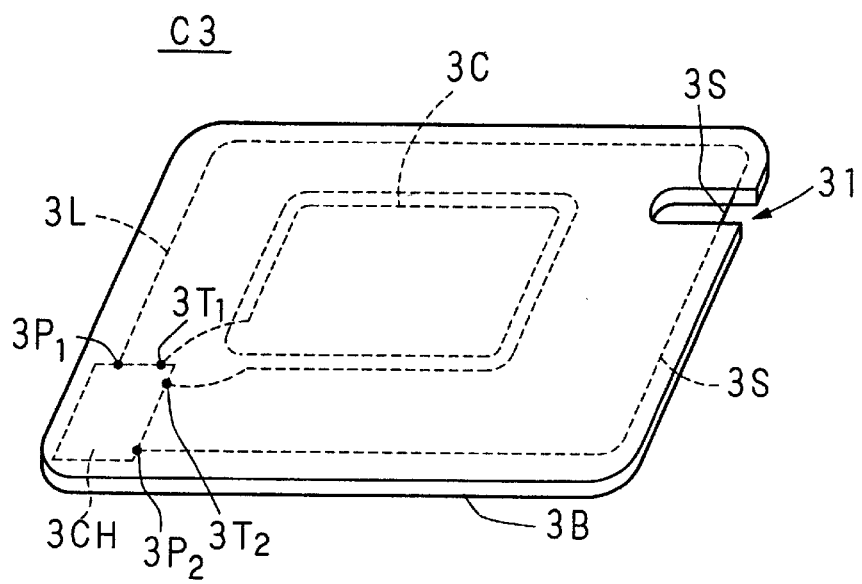
FIG. 3A is a perspective view of contactless IC card C3 of the third embodiment according to the present invention.

FIG. 3A is a perspective view of contactless IC card C3 of the third embodiment according to the present invention.

The contactless IC card C3 comprises card substrate 3B, electromagnetic coupling coil 3C, IC chip 3CH, outside terminals $3T_1$ and $3T_2$, lead wire 3L having a rounded-square shape, lead wire connecting terminals (or pads) $3P_1$ and $3P_2$, and U-shaped notch 31.

Figure 3B:
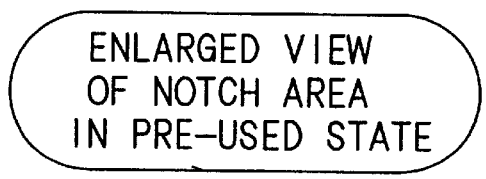
FIGS. 3B and 3C are enlarged views of notch 31 area of the card C3 in the pre-used and in-use states.
Figure 3B:
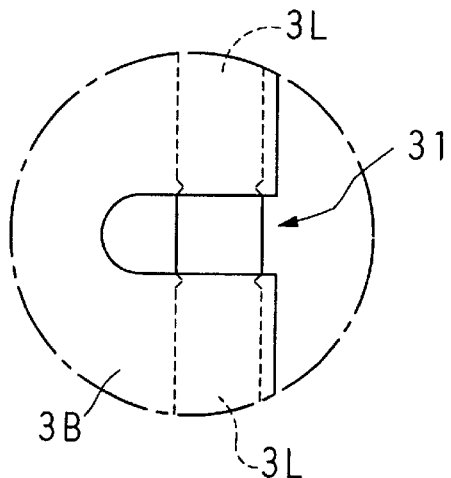
Figure 3C:
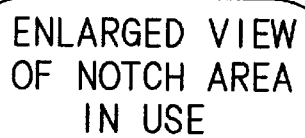
Figure 3C:
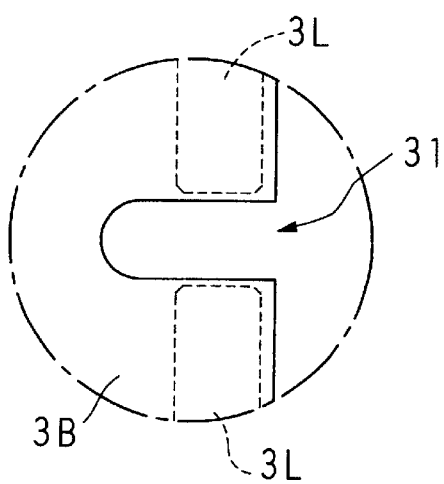

Almost all the portion of lead wire 3L is included in substrate 3B, and the remaining portion is exposed at the notch 31 (refer to FIG. 3B). Regarding the notch 31 area, a user can cut lead wire 3L by, for example, hooking the wire at the user's nail, and thereby the user can start to use this IC card (refer to FIG. 3C).

Regarding the contactless IC card C3, even in a pre-used state, that is, in a state in which the lead wire 3L has not yet been cut, electromagnetic coupling coil 3C is not short-circuited; thus, communication with the IC card reader-writer is possible. In an initial anti-collision operation using the IC card reader-writer, an initial response request is sent to the contactless IC card C3, and the IC card C3 returns information relating to a protocol to be used, the kind of the IC card, and a possible degree of use, as a response. In this case, IC chip 3CH checks whether the lead wire connecting terminals $3P_1$ and $3P_2$ are connected with each other, by, for example, applying a voltage to lead wire connecting terminal $3P_1$. That is, if the contactless IC card C3 has not yet been used, current is generated around the rounded-square shaped lead wire 3L by applying voltage to the lead wire connecting terminal. Therefore, by detecting the current, the IC chip CH3 can recognize that the contactless IC card C3 has not yet been used. The contactless IC card C3 then sends the IC card reader-writer 200 information indicating that the IC card C3 has not yet been used, as an initial response.

When the IC card reader-writer 200 receives such information indicating a pre-used state, the state that the contactless IC card C3 has not yet been used is shown in a display (such as an LCD display) of an external device which includes the IC card reader-writer 200.

After sending the information indicating a pre-used state, the contactless IC card C3 does not communicate with the IC card reader-writer. Therefore, the user can recognize that it is impossible to use the IC card in the present state and understand the necessity of cutting lead wire 3L so as to start to use the card. In the above operation, restricted communication may be continued after sending the information indicating a pre-used state. That is, information relating to functions other than the subtraction of the degree of use, such as a "telephone directory" function, may be communicated and be operable.

Therefore, in the present embodiment, in a first state in which lead wire connecting terminals $3P_1$ and $3P_2$ are connected with each other via lead wire 3L, IC card C3 can perform only restricted communication (that is, communication relating to functions to be previously performed before ordinary usage) with IC card reader-writer 200. In a second state in which lead wire connecting terminals $3P_1$ and $3P_2$ are not connected with each other by cutting lead wire 3L at notch 31, communication between the main body and the IC card reader-writer is possible without restriction (that is, communication relating to ordinary usage). In this way, if the contactless IC card C3 is used as a phone card, it is possible to display the degree of use, for example, "50" (units) and a message like "PLEASE MAKE THE CARD POSSIBLE TO USE", so as to advise the user to start to use the card.

According to the above operations, it is possible to prevent an undesired situation in which the card is unfairly used before a valid user starts to use the card (in other word, an unfairly used card can be distinguished). Additionally, lead wire 3L is cut in this embodiment; thus, it is unnecessary to provide a separable portion like ID of the above explained contactless IC card C1. Therefore, in the present case, it is possible to prevent generation of an unwanted portion caused by separating the separable portion.

In order to cut exposed lead wire 3L at notch 31, a lead wire cutting device having a projecting portion or the like may be attached to an external device including IC card reader-writer 200 (as shown in FIG. 11), to a contactless IC card vending machine, or to a collection box for used contactless IC cards. In this case, lead wire 3L can be cut by hooking the wire on the cutting device.

In addition, before the contactless IC card C3 sends an initial response to IC card reader-writer 200, it is possible for contactless IC card C3 itself to check the possible degree of use recorded and stored in IC chip 3CH and judge whether the checked degree corresponds to a pre-used state, and only in the case in which the degree indicates the pre-used state, contactless IC card C3 may detect the state of the lead wire connecting terminals, by its own processing.

In the above operations, detection of the state of the lead wire connecting terminals is performed with reference to the degree of use. However, it is also possible that a starting flag is used and is set to be in an "on" state when the usage is started, and that the state of the usage of the card is judged according to the state of this flag.

Instead of providing the function of detecting "whether the lead wire is cut" to the contactless IC card C3 itself, the following operation is possible in which when the contactless IC card C3 sends internal information as an initial response to an external device including IC card reader-writer 200, the external device may send the contactless IC card C3 a request for checking the state of the lead wire connecting terminals $3P_1$ and $3P_2$, and the above judgment operation is performed according to a response to the request.

Hereinbelow, contactless IC card C4 as the fourth embodiment of the present invention will be explained. The basic structure of the contactless IC card C4 is the same as the above explained contactless IC card C3.

Figure 4A:
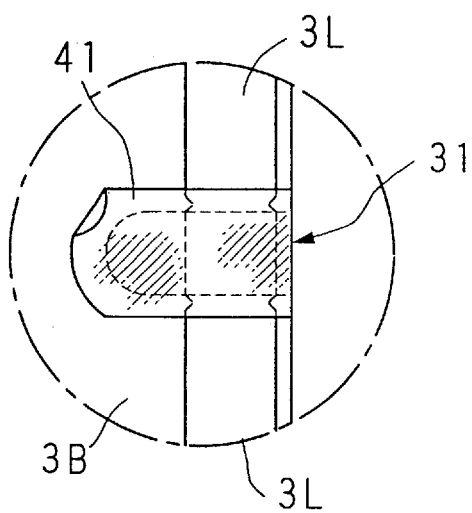
FIGS. 4A and 4B are enlarged views of notch 31 area of the card C4 in the pre-used and in-use states.

FIG. 4A is an enlarged view of the U-shaped notch 31 in the contactless IC card C4. As shown in the figure, the contactless IC card C4 is the same as the contactless IC card C3 except that seal 41 for protecting the IC card C4 is provided.

Figure 4B:
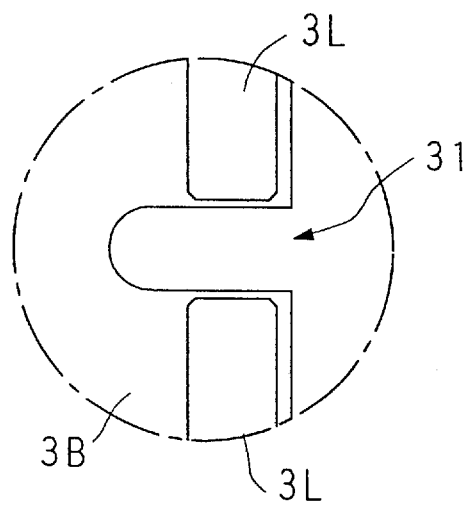

That is, in a pre-used state as shown in FIG. 4A, contactless IC card C4 corresponds to contactless IC card C3 with protection seal 41. When the protection seal 41 is peeled from the contactless IC card C4 and lead wire 3L is cut, the contactless IC card C4 is just the same as the contactless IC card C3, as shown in FIG. 4B.

The protection seal 41 is provided for preventing the lead wire 3L, which is exposed at notch 31, from breaking during transportation of the card, or the like.

When a user intends to start to use the contactless IC card C4, it is necessary to peel the protection seal 41 and to cut lead wire 3L at notch 31. According to this cutting operation, it may be acknowledged that the user has started to use the contactless IC card C4. Therefore, a user can reliably obtain a fair pre-used contactless IC card C4 from an issuer.

It is possible that once the protection seal 41 is peeled, the seal cannot be stuck again. In this case, an undesired situation in which an already-used card is unfairly sold as a pre-used card can be prevented.

The protection seal 41 and the lead wire 3L may be stuck to each other so as to automatically cut the wire at the time of peeling the seal. In this case, the user's operation of cutting the lead wire, performed after peeling the protection seal 41, can be saved.

In addition, the above-explained structure having a notch may be applied to the second embodiment. That is, a portion of electromagnetic coupling coil $2C_2$ in FIG. 2 is exposed at a notch like notch 31 and the exposed portion is cut so as to make the card usable.

Figure 5:
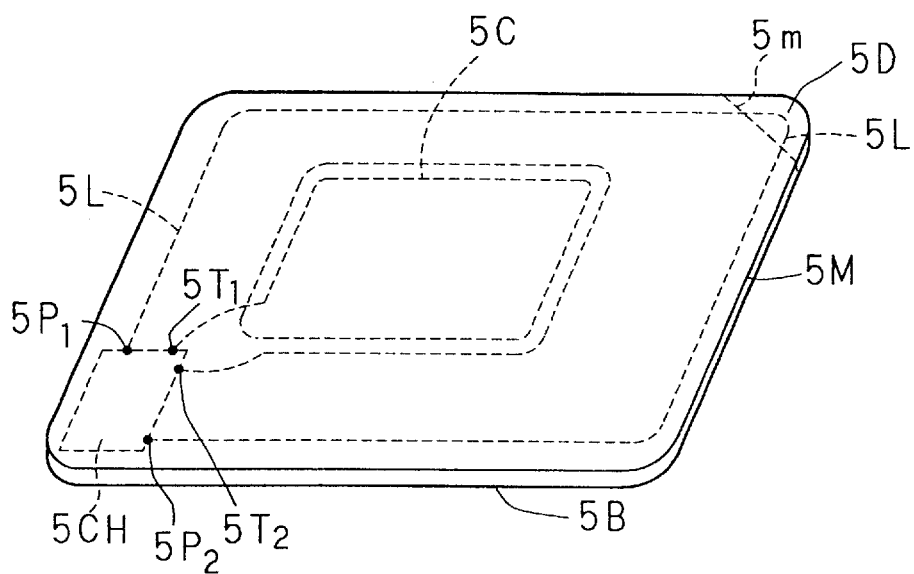
FIG. 5 is a perspective view of contactless IC card C5 of the fifth embodiment according to the present invention.

FIG. 5 is a perspective view of contactless IC card C5 of the fifth embodiment according to the present invention.

The contactless IC card C5 comprising card substrate 5B is composed of main body 5M and separable portion 5D. The main body 5M comprises electromagnetic coupling coil 5C, IC chip 5CH, outside terminals $5T_1$ and $5T_2$, lead wire 5L having a rounded-square shape, and lead wire connecting terminals $5P_1$ and $5P_2$. The separable portion 5D includes a portion of lead wire 5L. Between the main body 5M and separable portion 5D, perforation 5m is provided. By bending or twisting the contactless IC card C5 with respect to the perforation 5m as a boundary, it is possible to separate the separable portion 5D from the main body 5M. According to this separation, lead wire 5L is cut at perforation 5m as the boundary, and the lead wire connecting terminals $5P_1$ and $5P_2$ are opened.

Regarding the contactless IC card C5, as in the third (or fourth) embodiment, even in a pre-used state in which main body 5M and separable portion 5D has not yet been separated, electromagnetic coupling coil 5C is not short-circuited; thus, communication with the IC card reader-writer is possible in this state. Therefore, as in the third embodiment, when an initial response request is sent from the IC card reader-writer to contactless IC card C5, the IC card C5 can return information relating to a protocol to be used, the kind of the IC card, and the degree of use, as a response. In this operation, IC chip CH5 checks whether the lead wire connecting terminals $5P_1$ and $5P_2$ are connected with each other by, for example, applying a voltage to lead wire connecting terminal $5P_1$.

In a pre-used state of the contactless IC card, the main body 5M and the separable portion 5D are not separated and main portions of the lead wire 5L included in the main body 5M and the remaining portion of lead wire 5L included in the separable portion 5D are connected with each other. Therefore, if voltage is applied to the lead wire connecting terminal, then current is generated around the rounded-squared lead wire 5L. The following operations are similar to those performed in the third embodiment. That is, after sending information relating to the pre-used state, the contactless IC card C5 does not perform communication with the IC card reader-writer. Therefore, the user recognizes that the contactless IC card C5 cannot be used in the present state and understands the necessity of separating the separable portion 5D from the main body 5M so as to use the card.

If the separable portion 5D is separated from the main body 5M and IC chip 5CH detects the state of lead wire connecting terminals $5P_1$ and $5P_2$ by applying voltage to the lead wire connecting terminal, then no current flows in lead wire 5L and the IC chip 5CH recognizes that the contactless IC card C5 is in use. When the IC chip 5CH recognizes such an in-use state, the chip 5CH performs the following communication.

In this way, a user can reliably obtain a pre-used contactless IC card C4 from an issuer.

As in the third embodiment, before the contactless IC card C5 sends an initial response to IC card reader-writer 200, it is possible for contactless IC card C5 itself to check the possible degree of use recorded and stored in IC chip 5CH and judge whether the degree corresponds to a pre-used state, and only in the case in which the degree indicates the pre-used state, contactless IC card C5 may detect the state of the lead wire connecting terminals, of its own initiative.

Also in the third embodiment, instead of providing the function of detecting "whether the lead wire is cut" to the contactless IC card C5 itself, the following operation is possible in which when the contactless IC card C5 sends internal information as an initial response to an external device including IC card reader-writer 200, the external device may send the contactless IC card C5 a request for checking the state of the lead wire connecting terminals $5P_1$ and $5P_2$, and the above judgment operation is performed according to a response to the request.

On the other hand, in general operations for manufacturing the contactless IC cards, (i) a core sheet in which an IC chip and an antenna like an electromagnetic coupling coil are mounted is made, (ii) an IC card is made by putting the core sheet between over sheets, and (iii) necessary information is written (or encoded) via wireless communication. That is, in the processes from manufacturing to issuance, the encoding operation can be performed for a finished IC card as shown in FIG. 5. In this case, manufacturing costs can be reduced.

In the case of short-circuiting the antenna portion, as in the first embodiment shown in FIG. 1, data writing by wireless transmission cannot be performed after a finished IC card (body) is obtained. That is, the short-circuited antenna cannot be operated. Therefore, before an IC chip is mounted, necessary data must be written via wired communication by directly providing terminals in the IC chip. In another possible method, the encoding operation is performed in a state in which an IC chip and an antenna are mounted to a core sheet, and the antenna is then short-circuited and the core sheet is covered with over sheets. Such operations cause cost to rise. In contrast, in the contactless IC cards C3 and C5 in which two independent input terminals are provided, complicated operations as described above are unnecessary if only a condition that an encoding operation can be performed in a pre-used state is previously established. Therefore, the encoding operation can easily be performed after making of the body of an IC card is finished.

In the contactless IC card C5, IC chip 5CH is mounted at the opposite corner on a diagonal line with respect to perforation 5m. By mounting the IC chip 5CH far from the perforation 5m like this, the IC chip 5CH can be protected from a stress or impact imposed when a user separates the separable portion 5M from the main body 5D.

On the other hand, test pads used in a screening process of chips (such as the burn-in process) performed in the manufacturing of IC chips 5CH may be used as lead wire connecting terminals $5P_1$ and $5P_2$. In this case, a countermeasure for blocking unfair access to the IC chip 5CH from the cut portion at the perforation 5m must be taken in the IC chip 5CH. By effectively using the above test pads, costs can be further reduced.

Figure 6A:
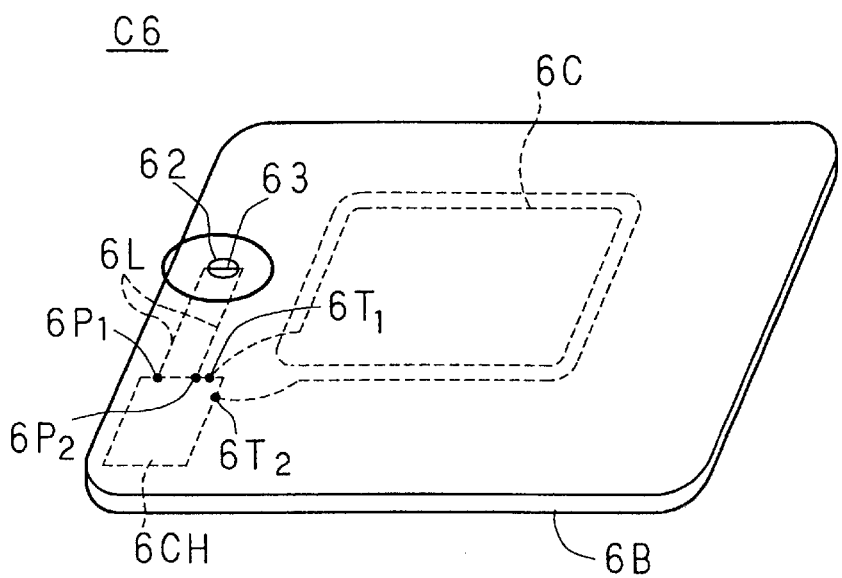
FIG. 6A is a perspective view of contactless IC card C6 of the sixth embodiment according to the present invention.

FIG. 6A is a perspective view of contactless IC card C6 of the sixth embodiment according to the present invention.

As shown in the figure, the contactless IC card C6 comprises card substrate 6B, electromagnetic coupling coil 6C, IC chip 6CH, outside terminals $6T_1$ and $6T_2$, lead wires 6L, lead wire connecting terminals $6P_1$ and $6P_2$, indicator 62 for indicating the state of usage, and fuse 63. The bold circle in FIG. 6A corresponds to enlarged views in FIGS. 6B and 6C.

In this structure, while the contactless IC card C6 has not yet been used, fuse 63 is not fused, and once the contactless IC card C6 is used, then the fuse 63 is fused by IC chip 6CH.

Figure 6B:
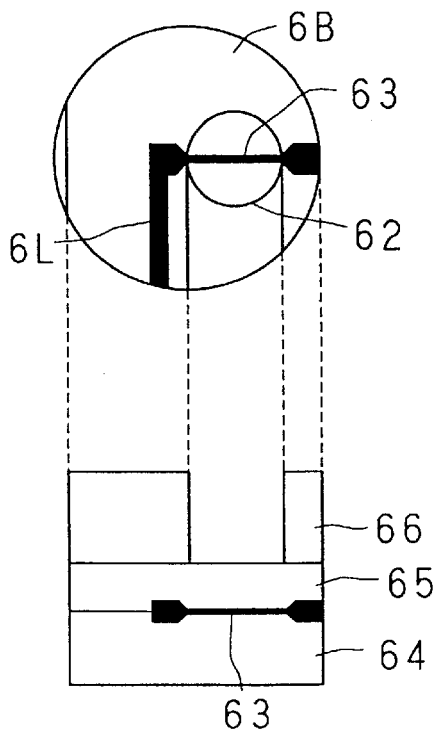
FIGS. 6B and 6C are diagrams showing usage state indicator 62 of the card C6 in the pre-used and in-use states.

As shown in FIG. 6B, fuse 63 exists in usage state indicator 62, and is connected to lead wires 6L in the neighborhood of the indicator 62. The lead wires 6L are connected to IC chip 6CH via lead wire connecting terminals $6P_1$ and $6P_2$ which are independent of outside terminals $6T_1$ and $6T_2$.

The user can confirm whether or not the fuse 63 is fused by peeping into the usage state indicator 62 from the surface side of the card.

Here, a design indicated by the user may be printed on the surface of the card C6; thus, it is preferable that usage state indicator 62 be provided on the back face of the card.

In the embodiment of FIG. 6B which shows a sectional view of the usage state indicator 62, a circular hole is provided in over sheet 66 on the back face of the card and the state of fuse 63 can be observed through transparent core sheet 65 (from above the core sheet). According to the above structure, the fuse 63 can be protected from the outside. If fuse 63 is positioned on the core sheet 65, this area should be covered with a transparent protection sheet.

Also in the contactless IC card C6, electromagnetic coupling coil 6C is not short-circuited; thus, communication with IC card reader-writer 200 is possible even though the contactless IC card C6 has not yet been used.

When the contactless IC card C6 starts to communicate with the IC card reader-writer 200, the card C6 checks whether the two lead wire connecting terminals $6P_1$ and $6P_2$ are connected with each other by, for example, applying a voltage to the lead wire connecting terminals, before returning an initial response with respect to an initial response request sent from the IC card reader-writer 200. In this checking operation, a voltage which cannot disconnect fuse 63 is applied between the lead wire connecting terminals $6P_1$ and $6P_2$; thus, current flows while fuse 63 is not disconnected and the two lead wires 6L are connected with each other via the fuse. By detecting this current injection, the IC chip 6CH recognizes that the contactless IC card C6 has not yet been used.

Figure 6C:
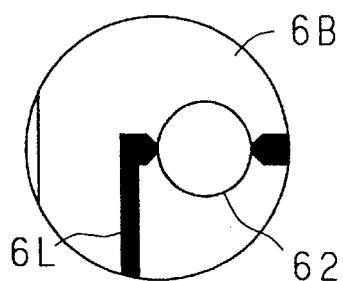

The IC chip 6CH which recognized the pre-used state of the IC card enters into a charge mode and power accumulation starts. When a first unit of the card is deducted, the accumulated power is discharged to the lead wire connecting terminals $6P_1$ and $6P_2$ and a large current flows through the lead wire 6L and the fuse 63 is fused and disconnected. The state of the disconnected fuse 63 is shown in FIG. 6C. By visually observing such a state of the disconnected fuse 63 from usage state indicator 62, the user can judge whether the contactless IC card C6 has not yet been used or has already been used. If the contactless IC card C6 is in use (that is, fuse 63 is disconnected), when the IC chip 6CH checks the state of lead wire connecting terminals $6P_1$ and $6P_2$ (that is, a voltage is applied between the terminals), no current flows in lead wires 6L. Therefore, current injection is not detected, and thereby the IC chip 6CH can detect that the contactless IC card C6 has already been used. In this case, the following communication is performed.

Before returning an initial response, the contactless IC card C6 may send the possible degree of use and the kind of the card to an external device which includes IC card reader-writer 200. In this case, the external device judges whether the contactless IC card C6 has not yet been used, based on the sent information, and if it was judged that the card has not yet been used, then the external device sends a signal for commanding a charge operation to the contactless IC card C6 and the IC chip 6CH which received the command enters into a charge mode. Another operation is possible in which the external device sends a command for subtracting the first unit, and when this sending operation is normally finished, a fusing command is sent to the contactless IC card C6 and the IC chip 6CH which received the command discharges a charged power to the lead wire connecting terminals $6P_1$ and $6P_2$.

In this way, a pre-used contactless IC card C6 can be safely handed over from an issuer to a user, and when subtraction of the first unit is performed, it is possible to notify the user that the card is already in use. In addition, when a user starts to use a contact less IC card C6, it is unnecessary for the user to take any measures for the card so as to change its appearance; thus, the user can more easily handle the card.

Figure 7A:
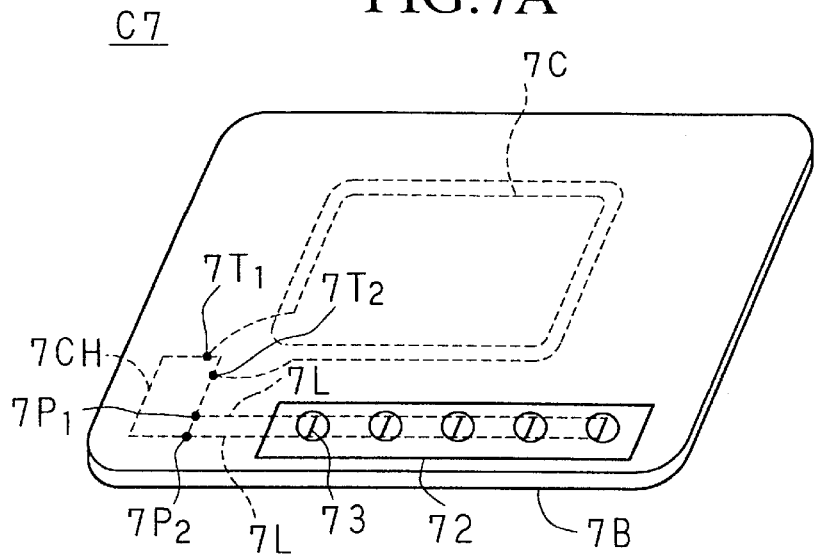
FIG. 7A is a perspective view of contactless IC card C7 of the seventh embodiment according to the present invention.

FIG. 7A is a perspective view of contactless IC card C7 of the seventh embodiment according to the present invention.

Figure 7B:
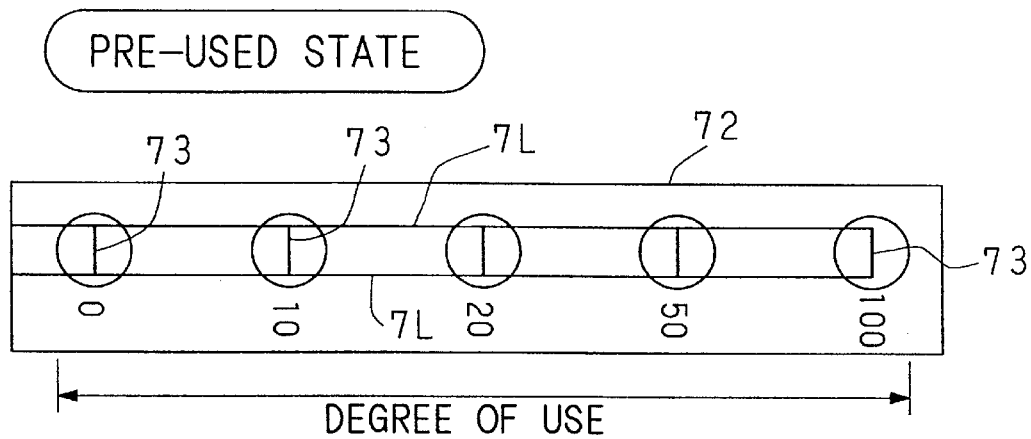
FIGS. 7B and 7C are diagrams showing usage state indicator 72 of the card C7 in the pre-used and in-use states.
Figure 7C:
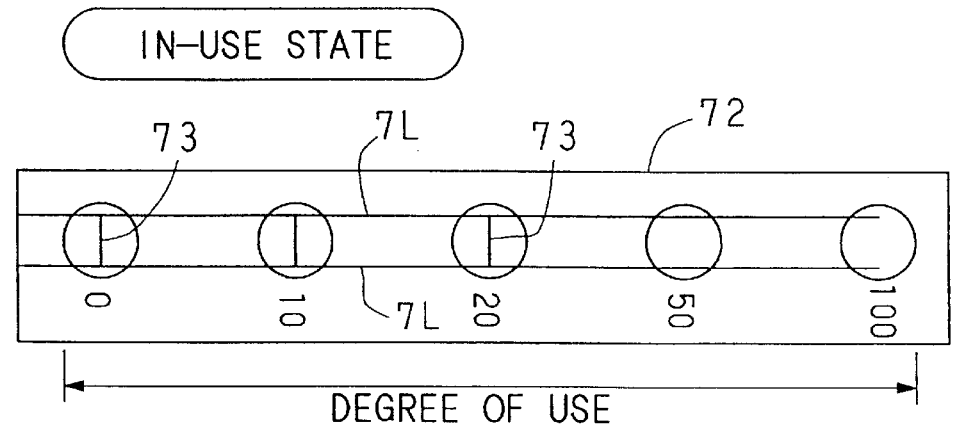

As shown in the figure, the contactless IC card C7 comprises card substrate 7B, electromagnetic coupling coil 7C, IC chip 7CH, outside terminals $7T_1$ and $7T_2$, lead wires 7L, indicator 72 for indicating the state of usage, lead wire connecting terminals $7P_1$ and $7P_2$, and fuses 73. The difference of contactless IC card C7 from contactless IC card C6 is that plural fuses 73 are provided in usage state indicator 72, as shown in FIGS. 7B and 7C. These figures show an example in which five fuses 73 are connected with lead wires 7L connected to the lead wire connecting terminals $7P_1$ and $7P_2$, in an initial state.

An example in which the contactless IC card C7 has a degree of usage of 100 units will be explained. When the contactless IC card C7 has not yet been used, then as in the case of the contactless IC card C6, a fuse corresponding to the "100 units" in the usage state indicator 72 is fused at the time of deducting the first unit. When the fiftieth unit is deducted so as to shift to the forty-ninth unit (that is, when the remaining possible units of use changes from 50 to 49), the IC chip 7CH recognizes that the present internal degree of use is 50 units and enters into a charge mode. At the same time as changing the degree of use to 49 units, the IC chip 7CH discharges the charged power to lead wire connecting terminals connected to the fuse which exists in an indicating area corresponding to the fiftieth unit.

After that, such charge/discharge operations are not performed by the time when the possible degree of use becomes 20 units. In the state as shown in FIG. 7C, the fuses corresponding to the possible degrees of use of 100 and 50 units are fused and fuse corresponding to the possible degree of use of 20 units is not fused; thus, the user can understand that the present possible degree of use of the contactless IC card C7 is more than 20 units and less than 50 units by observing this state.

In this way, the user of the contactless IC card C7 can understand the state of usage of this card in detail and can approximately estimate the present possible degree of use without observing a display of an external device including IC card reader-writer 200, in which the accurate possible degree of use is shown.

Figure 8A:
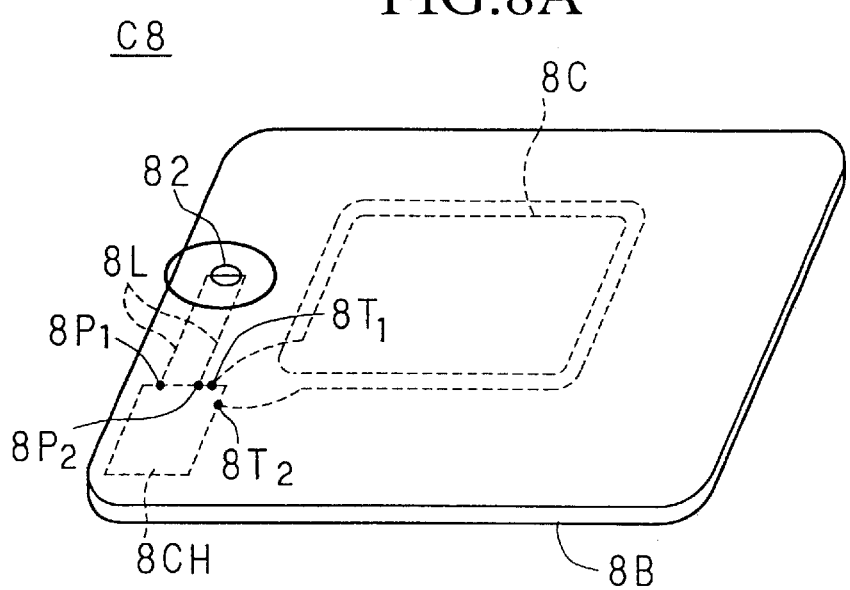
FIG. 8A is a perspective view of contactless IC card C8 of the eighth embodiment according to the present invention.

FIG. 8A is a perspective view of contactless IC card C8 of the eighth embodiment according to the present invention.

As shown in the figure, the contactless IC card C8 comprises card substrate 8B, electromagnetic coupling coil 8C, IC chip 8CH, outside terminals $8T_1$ and $8T_2$, lead wires 8L, lead wire connecting terminals $8P_1$ and $8P_2$, and indicator 82 for indicating the state of usage. The bold circle in FIG. 8A corresponds to enlarged views in FIGS. 8B and 8C.

Figure 8B:
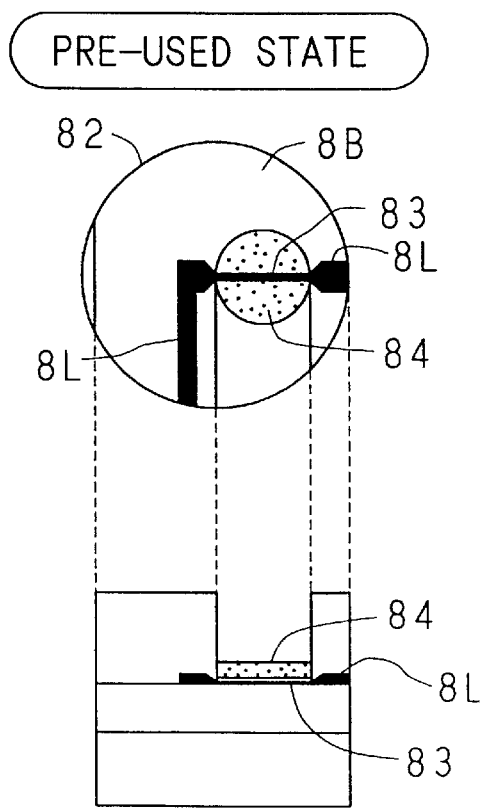
FIGS. 8B and 8C are diagrams showing usage state indicator 82 of the card C8 in the pre-used and in-use states.
Figure 8C:
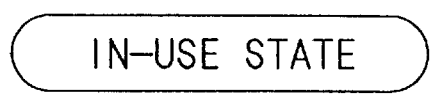

As shown in FIG. 8B, usage state indicator 82 includes heater 83 and thermochromic (or thermochromatic) material 84.

The difference of the contactless IC card C8 from the contactless IC card C6 is that heater 83 is used instead of a fuse and that the heater is coated with thermochromic material 84 or the like. A thermochromic material whose change of color is irreversible is selected as material 84.

At the time of the first deduction, current is supplied to lead wires 8L and the heater 83 is heated by this current, and the thermochromic materia 84 which receives the heat changes its color. As possible methods of providing current to heater 83, current is stored in the IC chip and the charged current is discharged at a stroke, as the above-explained method relating to the contactless IC card C6, or current is gradually supplied to heater 83. A suitable method is selected in dependence on thermal characteristics of the heater 83 and the thermochromic material 84.

According to the contactless IC card C8, the user can more clearly judge whether the card has already been used (that is, whether subtraction of the degree of use has already been performed).

It is possible that pairs of the heater 83 and thermochromic material 84 are respectively provided at plural areas in usage state indicator 82, and temperature applied to each thermochromic material 84 is adjusted by controlling the amount of heat generated in the corresponding heater 83 so that the temperature is changed for each thermochromic material 84. In this case, the plural areas in the usage state indicator 82 respectively experience different changes of color; thus, it is possible to indicate the usage state of the contactless IC card C8 step by step as in the case of the contactless IC card C7. Such a developed example will been shown below.

Figure 9A:
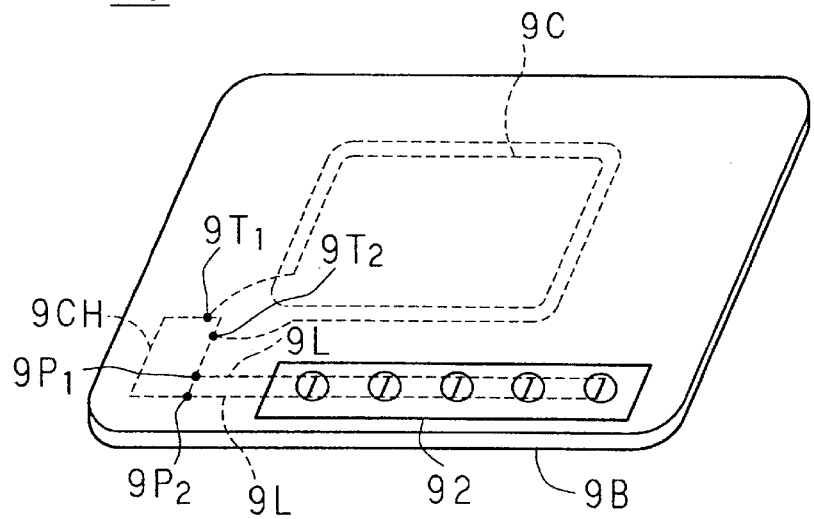
FIG. 9A is a perspective view of contactless IC card C9 of the ninth embodiment according to the present invention.

FIG. 9A is a perspective view of contactless IC card C9 of the ninth embodiment according to the present invention.

The contactless IC card C9 comprises card substrate 9B, electromagnetic coupling coil 9C, IC chip 9CH, outside terminals $9T_1$ and $9T_2$, lead wires 9L, lead wire connecting terminals $9P_1$ and $9P_2$, and indicator 92 for indicating the state of usage.

Figure 9B:
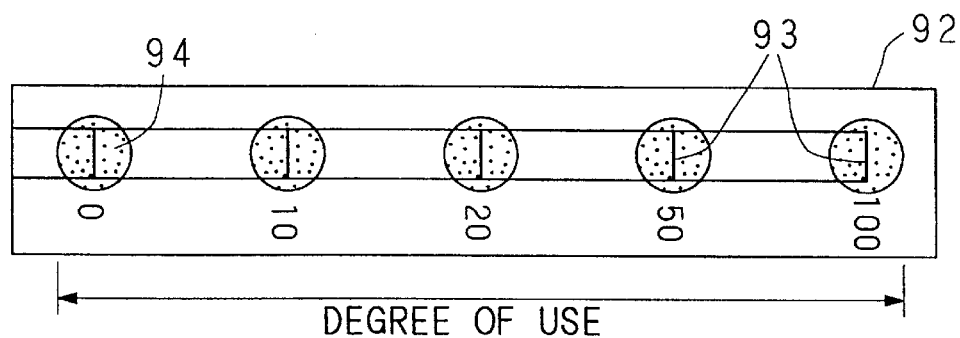
FIGS. 9B and 9C are diagrams showing usage state indicator 92 of the card C9 in the pre-used and in-use states.
Figure 9C:
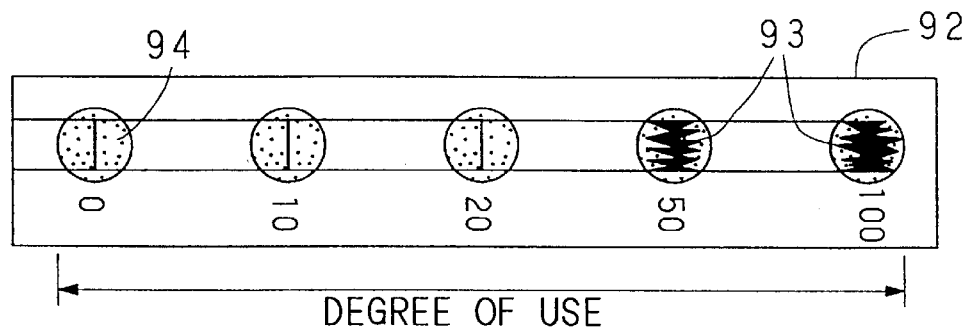

The contactless IC card C9 has a structure similar to that of the contactless IC card C8, and the internal structure of the usage state indicator 92 has plural divided areas as shown in the contactless IC card C7. FIGS. 9B and 9C show an example in which five pairs of heater 93 and thermochromic material 94 are connected with lead wires 9L which are connected to the lead wire connecting terminals $9P_1$ and $9P_2$. In the state shown in FIG. 9C, two heaters 93 corresponding to units 100 and 50 (of use) are heated with different amounts of energy and relevant thermochromic materials 94 are respectively changed to have different colors. In this case, a user of the contactless IC card C9 can clearly understand the state of usage by visual observation, and can estimate the remaining possible degree of use.

In the contactless IC cards C6–C9, instead of providing a usage state indicator inside the substrate of the card, such an indicator may be provided to an outside area (of the card substrate) in a manner such that the indicator is contacted with the substrate. For example, a fuse or the like is attached to a side face of the substrate.

Generally, an IC module of the contactless IC card has a substrate of about one centimeters square, on which an IC chip and an antenna are mounted. Regarding the contactless IC card, there are two types such that (i) the antenna is buried in most of the area of the card, as shown in the above-explained embodiments, and (ii) the card includes an IC module which has a substrate of about one centimeter square, only in which an antenna is buried inside. The basic difference between these types is only a size of the antenna; thus, the above-explained embodiments can be applied to both types.

Figure 10A:
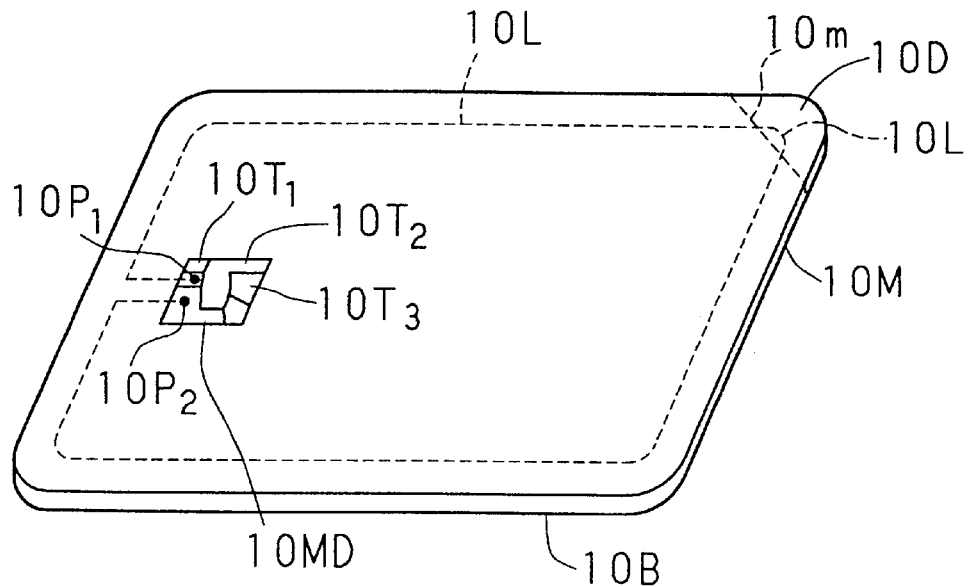
FIG. 10A is a perspective view of contact IC card C10 of the tenth embodiment according to the present invention.

FIG. 10A is a perspective view of contact IC card C10 of the tenth embodiment according to the present invention.

The above-described techniques of indicating the state of usage applied to the contactless IC cards C1–C9 may be applied to contact IC cards, and contact IC card C10 is an embodiment obtained by applying the indicating method of the contactless IC card C5 to a contact IC card.

The contact IC card C10 comprises main body 10M and separable portion 10D. The main body 10M includes IC module 10MD and lead wire 10L having a rounded-square shape, and separable portion 10D includes a portion of lead wire 10L.

The IC module 10MD has an integrated structure having an IC chip, outside terminals $10T_1$, $10T_2$, (six divided and exposed areas in IC module 10MD in FIG. 10A, which are golden metallic portions), and connection lines which connect the IC chip and each outside terminal.

In the contact IC card C10, perforation 10m is provided between the main body 10M and the separable portion 10D. By bending or twisting the IC card C10 with respect to the perforation 10m as a boundary, it is possible to separate the separable portion 10D from the main body 10M. According to this separation, lead wire 10L is cut at perforation 10m as the boundary. Here, the lead wire 10L is connected to terminals which are provided in IC module 10MD for exclusive use.

Figure 10B:
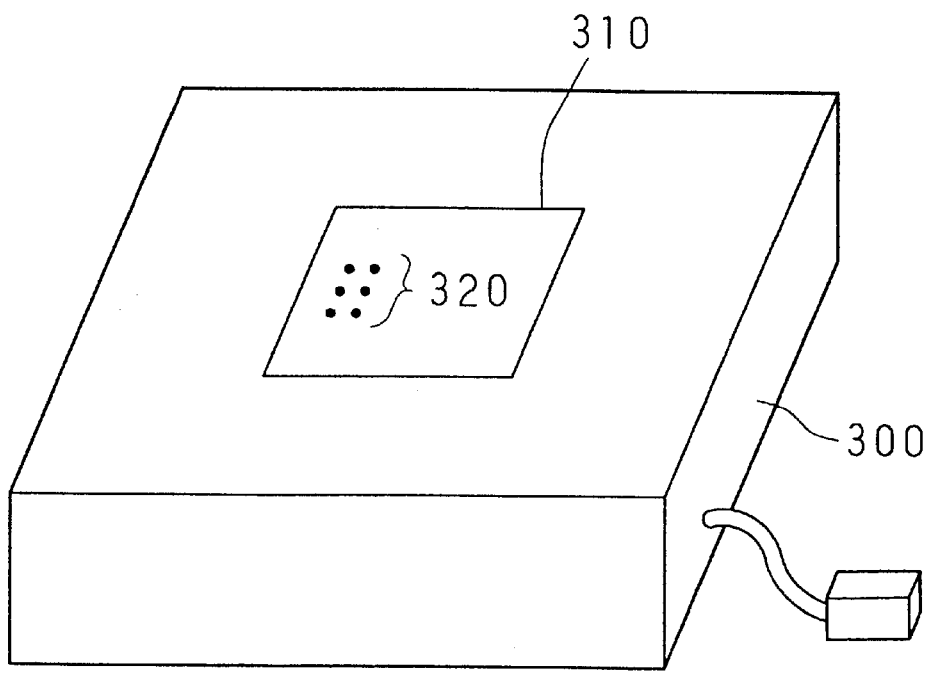
FIG. 10B shows the structure of IC card reader-writer 300 for communicating with the contact IC card C10.

FIG. 10B shows the structure of IC card reader-writer 300 for communicating with the contact IC card C10. In the IC card reader-writer 300, the contact IC card C10 is put on fitting area 310 which includes six probes 320 for connecting with six outside terminal $10T_1$, $10T_2$, ... of the contact IC card. That is, communication between the contact IC card C10 and IC card reader-writer 300 is realized by contacting communication probes 320 of IC card reader-writer 300 with outside terminals $10T_1, 10T_2, \ldots$ of the contact IC card C10. First, an initial response request is sent via the communication probes from IC card reader-writer 300. As other contact and contactless IC cards, the contact IC card C10 returns information such as a protocol to be used, the kind of the card, and the possible degree of use, as a response. In this operation, the IC module 10MD checks whether the lead wire 10L is linked via separable portion 10D (that is, whether the lead wire is not disconnected) by, for example, applying a voltage to lead wire 10L.

When the main body 10M and separable portion 10D are unified and the contact IC card C10 has not yet been used, lead wire 10L is not disconnected and thus current flows around the wire. In this state, the IC module 10MD can recognize that the card is in a pre-used state and outputs information indicating the pre-used state as the initial response. The IC card reader-writer 300 which received the above output information displays information, which indicates that the contact IC card C10 has not yet been used, to a display (like an LCD display) attached to the IC card reader-writer 300. After that, contact IC card C10 does not continue the communication.

Accordingly, the user can understand the necessity of finishing this pre-used state and making the card possible for use (that is, separable portion 10D must be separated from the main body 10M). If the contact IC card C10 is in use (that is, the separable portion 10D is separated from the main body 10M), when the IC module 10MD checks the state of lead wire 10L (by applying a voltage), no current flows in lead wire 10L and thereby it can be detected that the card has already been used. In this state, the following communication is continued.

Regarding the operation of checking the state of lead wire 10L, it is also possible that before returning the initial response, the contact IC card C10 itself checks the possible degree of use stored in the IC module 10MD and judges whether the degree indicates a pre-used state, and that only when the degree indicates the pre-used state, the contact IC card C10 itself performs the checking operation of the lead wire. Another method is also possible in which the function of judging the state of lead wire 10L is not provided to the contact IC card C10 itself and the IC card C10 sends internal information relating to the card to an external device including IC card reader-writer 300, and that the external device judges whether the card has not yet been used based on information with respect to the kind of the card C10 and the possible degree of use. When the card is in the pre-used state, the external device sends the contact IC card C10 a request for checking the state of lead wire 10L, and according to a response to the request, it is confirmed whether or not the main body 10M and separable portion 10D are separated.

As explained above, according to the contact IC card C10, a pre-used contact IC card (C10) can be safely handed over from an issuer to a user.

Each of the above-mentioned embodiments functions as an IC card system consisting of an IC card and an IC card reader-writer. In each system arrangement, the IC card is fed electricity via electromagnetic coupling so as to realize data transmission with the IC card reader-writer. However, instead of the electromagnetic coupling, electrostatic coupling may by used for supplying electric power to an IC card and for performing similar data transmission.

What is claimed is:

1. A method of indicating a state of usage of an IC card which is fed electricity from an IC card reader-writer via feeding means using one of electromagnetic coupling and electrostatic coupling, and the IC card having an IC chip which communicates with the IC card reader-writer, the method comprising the steps of:
   short-circuiting the feeding means so as to make the IC card unusable; and
   making the card usable by freeing the short-circuited state, and also making appearance of the card different according to the short-circuiting operation.

2. A method of indicating a state of usage of an IC card which is fed electricity from an IC card reader-writer via feeding means using one of electromagnetic coupling and electrostatic coupling, and the IC card having an IC chip which communicates with the IC card reader-writer, wherein:
   the IC chip comprises two lead wire connecting terminals, and the method comprising the steps of:
   short-circuiting the two lead wire connecting terminals so as to make the IC card unusable; and
   making the card usable by freeing the short-circuited state, and also making appearance of the card different according to the short-circuiting operation.

3. A method of indicating a state of usage of an IC card which is fed electricity from an IC card reader-writer via feeding means using one of electromagnetic coupling and electrostatic coupling, and the IC card having an IC chip which communicates with the IC card reader-writer, the method comprising the steps of:
   generating a current having a reversed polarity with respect to a current generated by the feeding means in the IC card so as to make the IC card unusable; and
   making the card usable by disconnecting the current of the reversed polarity, and also making appearance of the card different according to the disconnection.

4. A method as claimed in claim 1, further comprising the step of indicating information relating to a state of usage of the IC card.

5. A method as claimed in claim 2, further comprising the step of indicating information relating to a state of usage of the IC card.

6. A method as claimed in claim 3, further comprising the step of indicating information relating to a state of usage of the IC card.

7. A method as claimed in claim 4, wherein the information relating to the state of usage is indicated according to a fused or pre-fused state of a fuse.

8. A method as claimed in claim 5, wherein the information relating to the state of usage is indicated according to a fused or pre-fused state of a fuse.

9. A method as claimed in claim 6, wherein the information relating to the state of usage is indicated according to a fused or pre-fused state of a fuse.

10. A method as claimed in claim 4, wherein the information relating to the state of usage is indicated according to a change of color of a thermochromic material which received heat.

11. A method as claimed in claim 5, wherein the information relating to the state of usage is indicated according to a change of color of a thermochromic material which received heat.

12. A method as claimed in claim 6, wherein the information relating to the state of usage is indicated according to a change of color of a thermochromic material which received heat.

* * * * *